(12) United States Patent
Kim

(10) Patent No.: US 11,967,354 B2
(45) Date of Patent: Apr. 23, 2024

(54) MEMORY DEVICE AND OPERATING METHOD FOR TARGET REFRESH OPERATION BASED ON NUMBER OF ACCESSES

(71) Applicant: SK hynix Inc., Gyeonggi-do (KR)

(72) Inventor: Woongrae Kim, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 13 days.

(21) Appl. No.: 17/685,054

(22) Filed: Mar. 2, 2022

(65) Prior Publication Data
US 2023/0154521 A1 May 18, 2023

(30) Foreign Application Priority Data

Nov. 12, 2021 (KR) .......................... 10-2021-0155701

(51) Int. Cl.
*G11C 11/406* (2006.01)
*G11C 7/10* (2006.01)
*G11C 11/4072* (2006.01)
*G11C 11/4096* (2006.01)

(52) U.S. Cl.
CPC ...... *G11C 11/40618* (2013.01); *G11C 7/1039* (2013.01); *G11C 11/40615* (2013.01); *G11C 11/4072* (2013.01); *G11C 11/4096* (2013.01)

(58) Field of Classification Search
CPC ........ G11C 11/40618; G11C 11/40615; G11C 11/4096; G11C 11/4072; G11C 11/40611; G11C 11/408; G11C 7/1039; G06F 3/0659
See application file for complete search history.

(56) References Cited

U.S. PATENT DOCUMENTS

| | | | |
|---|---|---|---|
| 6,292,385 B1 * | 9/2001 | Kim ........................ | G11C 11/22 365/210.13 |
| 2016/0077940 A1 * | 3/2016 | Son ...................... | G06F 11/1048 714/6.22 |
| 2020/0251158 A1 | 8/2020 | Shore et al. | |
| 2023/0094684 A1 * | 3/2023 | Kim .................. | G11C 11/40622 365/222 |
| 2023/0128653 A1 * | 4/2023 | You ..................... | G11C 11/4063 365/218 |
| 2023/0141789 A1 * | 5/2023 | Cho .................. | G11C 11/40622 365/222 |

FOREIGN PATENT DOCUMENTS

KR 10-2014834 B1 8/2019

* cited by examiner

*Primary Examiner* — Sultana Begum
(74) *Attorney, Agent, or Firm* — IP & T GROUP LLP

(57) ABSTRACT

A semiconductor memory device includes: a memory cell region including normal cells and row-hammer cells coupled to each of a plurality of rows, wherein the row-hammer cells of a selected row are suitable for storing first data and second data, the first data representing a number of accesses to the selected row and the second data denoting whether to refresh second adjacent rows of the selected row; and a refresh control circuit suitable for: selecting a sampling address based on the first data read from a row corresponding to an input address when an active command is inputted, determining, in response to a refresh command, whether to refresh first adjacent rows of a target row corresponding to the sampling address, and determining, in response to the refresh command, whether to refresh second adjacent rows of the target row based on the second data read from the target row.

10 Claims, 6 Drawing Sheets

| FN1D | FN2D | TREF 1$^{ST}$ RH_ADD | TREF 2$^{ND}$ RH_ADD | TREF 3$^{RD}$ RH_ADD | TREF 4$^{TH}$ RH_ADD |
|---|---|---|---|---|---|
| L | L | select ADJ_ADD1 | — | — | — |
| H | L | select ADJ_ADD1 | select ADJ_ADD2 | select SAM_ADD & RH_RST "H" | — |
| H | H | select ADJ_ADD1 | select ADJ_ADD2 | select ADJ_ADD3 | select SAM_ADD & RH_RST "H" |

MEMORY DEVICE AND OPERATING METHOD FOR TARGET REFRESH OPERATION BASED ON NUMBER OF ACCESSES

CROSS-REFERENCE TO RELATED APPLICATION

The present application claims the benefit of Korean Patent Application No. 10-2021-0155701, filed on Nov. 12, 2021, which is incorporated herein by reference in its entirety.

BACKGROUND

1. Field

Various embodiments of the present invention relate to a semiconductor design technology, and more particularly, to a semiconductor memory device that performs a target refresh operation.

2. Description of the Related Art

Recently, in addition to a normal refresh operation, an additional refresh operation which will be, hereinafter, referred to as a 'target refresh operation', is being performed on the memory cells of a specific word line that is likely to lose data due to row hammering. The row hammering phenomenon refers to a phenomenon in which data of memory cells coupled to a specific word line or adjacent word lines disposed adjacent to the specific word line are damaged due to a high number of activations of the specific word line. In order to prevent the row hammering phenomenon, a target refresh operation is performed on a word line that is activated more than a predetermined number of times, and adjacent word lines disposed adjacent to the word line.

SUMMARY

Embodiments of the present invention are directed to a semiconductor memory device capable of disposing row-hammer cells respectively coupled to a plurality of rows of a memory cell region, respectively storing, into the row-hammer cells, a counting value obtained by counting the number of accesses of a corresponding row and information on whether to refresh adjacent rows classified according to physical distance from the corresponding row, and performing a target refresh operation depending on data stored in the row-hammer cells.

According to an embodiment of the present invention, a semiconductor memory device includes a memory cell region including a plurality of normal cells and a plurality of row-hammer cells coupled to each of a plurality of rows, wherein the row-hammer cells of a selected row are suitable for storing first data and second data, the first data representing a number of accesses to the selected row and the second data denoting whether to refresh second adjacent rows of the selected row; and a refresh control circuit suitable for: selecting a sampling address based on the first data read from a row corresponding to an input address when an active command is inputted, determining, in response to a refresh command, whether to refresh first adjacent rows of a target row corresponding to the sampling address, and determining, in response to the refresh command, whether to refresh second adjacent rows of the target row based on the second data read from the target row.

According to an embodiment of the present invention, a semiconductor memory device includes a memory cell region including a plurality of normal cells and a plurality of row-hammer cells coupled to each of a plurality of rows, wherein the row-hammer cells coupled to an n-th row include a plurality of counting cells suitable for storing a number of accesses to the n-th row, a first flag cell suitable for storing data denoting whether to refresh (n±2)-th adjacent rows of the n-th row, and a second flag cell suitable for storing data denoting whether to refresh (n±3)-th adjacent rows of the n-th row; a refresh control circuit suitable for: selecting a sampling address based on the number stored in the counting cells corresponding to an input address when an active command is inputted, calculating first to third adjacent addresses based on the sampling address, and outputting a row-hammer address by scheduling the first to third adjacent addresses based on the data stored in the first flag cell and the second flag cell when a target refresh command is issued; and a row control circuit suitable for refreshing one or more rows corresponding to the row-hammer address according to the target refresh command.

According to an embodiment of the present invention, an operating method of a semiconductor memory device including a plurality of normal cells and a plurality of row-hammer cells coupled to each of a plurality of rows, includes storing, into the row-hammer cells of a selected row, first data representing a number of accesses to the selected row and second data denoting whether to refresh second adjacent rows of the selected row; selecting a sampling address based on the first data read from a row corresponding to an input address when an active command is inputted; outputting a row-hammer address by determining whether to refresh first adjacent rows of a target row corresponding to the sampling address and whether to refresh second adjacent rows of the target row based on the second data read from the target row, when a target refresh command is issued; and refreshing one or more rows corresponding to the row-hammer address according to the target refresh command.

According to an embodiment of the present invention, an operating method of a memory device including plural rows each comprising memory cells, includes updating, whenever accessing a selected row among the plural rows, first data representing an accumulated number of accesses to the selected row, the first data being stored in the selected row; updating second data when the accumulated number reaches a threshold, the second data being stored in the selected row; refreshing first rows nearest to a target row, which is identified on the basis of the first data stored in a row indicated by an active address among the plural rows; refreshing, depending on the second data stored in the target row at a time of the refreshing of the first rows, second rows nearer to the target row than remaining rows among the plural rows; and initializing the first data and the second data stored in the target row after the refreshing of the second rows.

Further, according to embodiments of the present invention, the semiconductor memory device may respectively store a counting value obtained by counting the number of accesses of a corresponding row and information on whether to refresh adjacent rows classified according to physical distance from the corresponding row, into the row-hammer cells disposed in the memory cell region, and may select a row-hammer address depending on data stored in the row-hammer cells. Thus, the defense capability for row-hammer can be optimized and power consumption can be minimized. Further, since the semiconductor memory device may perform a target refresh operation according to the row-hammer address, the accuracy and refresh efficiency of a refresh operation can be improved.

DETAILED DESCRIPTION

Figure 1:
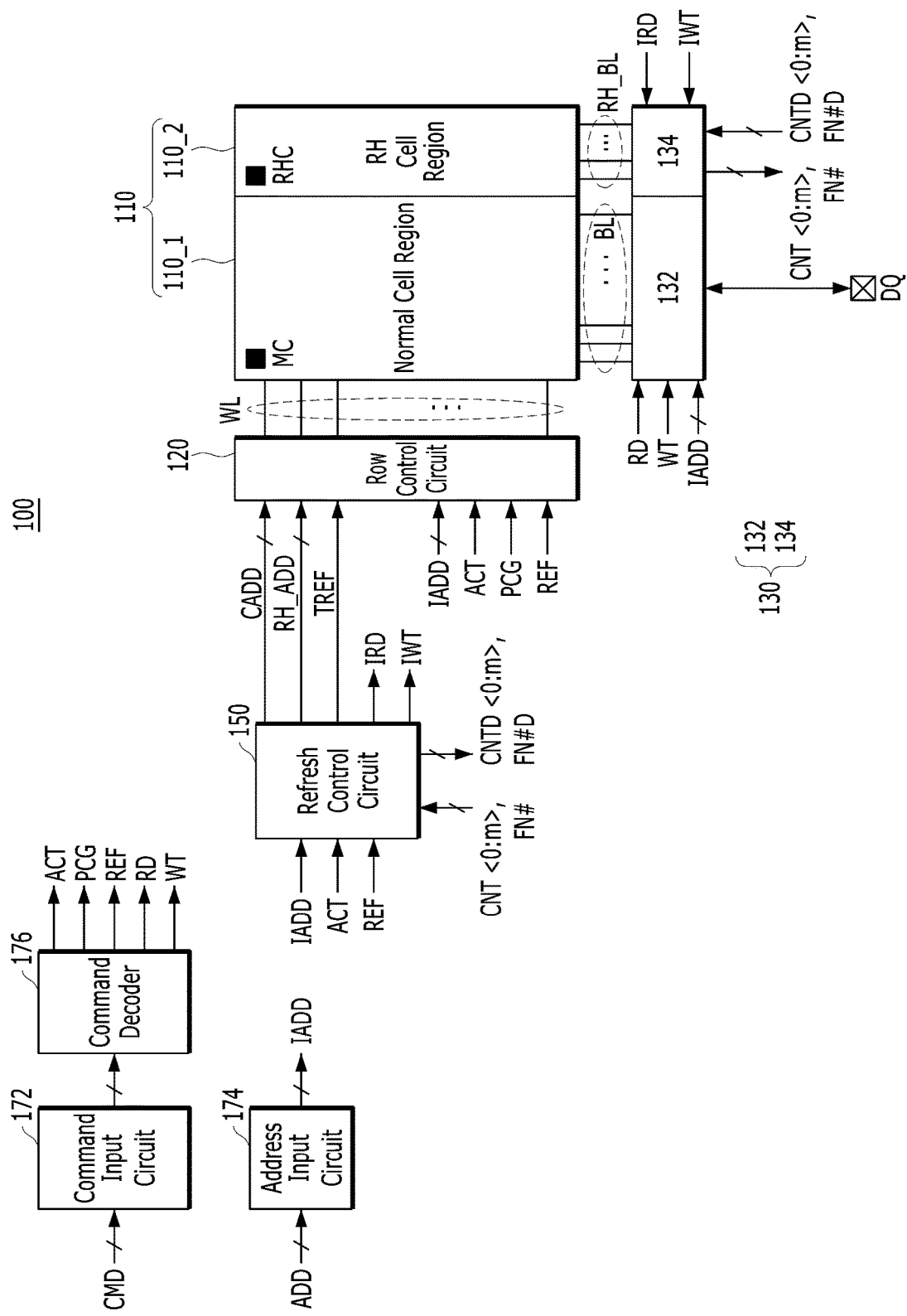
FIG. 1 is a block diagram illustrating a semiconductor memory device in accordance with an embodiment of the present invention.

Various embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

It will be understood that when an element is referred to as being "coupled" or "connected" to another element, it may mean that the two are directly coupled or the two are electrically connected to each other with another circuit intervening therebetween. It will be further understood that the terms "comprise", "include", "have", etc. when used in this specification, specify the presence of stated features, numbers, steps, operations, elements, components, and/or combinations of them but do not preclude the presence or addition of one or more other features, numbers, steps, operations, elements, components, and/or combinations thereof. In the present disclosure, the singular forms are intended to include the plural forms as well, unless the context clearly indicates otherwise.

FIG. 1 is a block diagram illustrating a semiconductor memory device 100 in accordance with an embodiment of the present invention.

Referring to FIG. 1, the memory device 100 may include a memory cell region 110, a row control circuit 120, a column control circuit 130, a refresh control circuit 150, a command input circuit 172, an address input circuit 174, and a command decoder 176.

The memory cell region 110 may include a plurality of memory cells MC and RHC which are arranged in an array type and coupled to a plurality of word lines WL (hereinafter, referred to as rows) and a plurality of bit lines BL and RH_BL (hereinafter, referred to as columns). Depending on an embodiment, the memory cell region 110 may include a plurality of banks. The number of banks or the number of memory cells MC and RHC may be determined depending on the capacity of the memory device 100. The rows WL may be extended into a first direction (e.g., a row direction), and sequentially arranged in a second direction (e.g., a column direction). In accordance with an embodiment, physically closest rows to a particular row in the column direction may be defined as first adjacent rows, and physically adjacent rows other than the first adjacent rows may be defined as second adjacent rows. For example, in a case of a K-th row among the rows WL, (k−1)-th and (k+1)-th rows, which are physically closest to the K-th row, may be defined as the first adjacent rows. Further, except for the first adjacent rows, physically adjacent (k−2)-th, (k−3)-th, (k−4)-th, . . . , and (k+2)-th, (k+3)-th, (k+4)-th rows may be defined as the second adjacent rows.

In accordance with an embodiment, the memory cell region 110 may be divided into a normal cell region 110_1 and a row-hammer (RH) cell region 110_2. A plurality of normal cells MC may be arranged in an array type in the normal cell regions 110_1, and a plurality of row-hammer cells RHC may be arranged in an array type in the row-hammer cell region 110_2. The plurality of normal cells MC and the plurality of row-hammer cells RHC may be coupled to each of the rows WL. The plurality of normal cells MC may store normal data including user data, and the plurality of row-hammer cells RHC may store first data CNT<0:m> for storing the number of accesses to a corresponding row, and second data FN # denoting whether to refresh the second adjacent rows of the corresponding row. A detailed configuration and operation of the memory cell region 110 will be described in FIG. 2.

The command input circuit 172 may receive a command CMD, and the address input circuit 174 may receive an address ADD, from an external device (e.g., a memory controller). The address input circuit 174 may receive the address ADD and output an internal input address IADD. Each of the command CMD and the address ADD may include a multi-bit signal. The command decoder 176 may decode the command CMD input through the command input circuit 172 and may generate an active command ACT, a precharge command PCG, a normal refresh command REF, a read command RD, and a write command WT. The command decoder 176 may generate a mode register set (MRS) command and other commands, by decoding received commands CMD.

When the active command ACT is inputted, the refresh control circuit 150 may select a sampling address (SAM_ADD of FIG. 3) based on the first data CNT<0:m> read out from a row corresponding to the internal input address IADD. Further, the refresh control circuit 150 may receive the first data CNT<0:m> and the second data FN # read out from the row corresponding to the internal input address IADD, and update the first data CNT<0:m> and the second data FN # as third data CNTD<0:m> and fourth data FN #D, respectively. The refresh control circuit 150 may control the third data CNTD<0:m> and the fourth data FN #D to be written in the row-hammer cells RHC of the corresponding row.

When the normal refresh command REF is inputted, the refresh control circuit 150 may output a row-hammer address RH_ADD by determining whether to refresh first adjacent rows of a target row corresponding to the sampling address SAM_ADD, and determining whether to refresh second adjacent rows of the target row based on the stored second data FN # (i.e., the fourth data FN #D). The refresh control circuit 150 may generate a counting address CADD that is increasing "+1" whenever the normal refresh command REF is inputted. In detail, the refresh control circuit 150 may issue a target refresh command TREF whenever the number of inputs of the normal refresh command REF reaches a preset number. When the target refresh command TREF is issued, the refresh control circuit 150 may control the first adjacent rows of the target row to be refreshed, and the second adjacent rows of the target row to be selectively refreshed based on stored second data FN # (i.e., the fourth data FN #D). After selectively refreshing the second adjacent rows of the target row, the refresh control circuit 150 may control the row-hammer cells RHC of the target row to be initialized by writing certain values (e.g., all-zero values) into the row-hammer cells RHC of the target row.

Moreover, when the active command ACT is inputted, the refresh control circuit 150 may sequentially issue an internal read signal IRD and an internal write signal IWT. The refresh control circuit 150 may issue the internal write signal IWT in order to initialize the row-hammer cells RHC of the target row. A detailed configuration and operation of the refresh control circuit 150 will be described in FIGS. 3 to 4B.

The row control circuit 120 may be coupled to the normal cells MC of the normal cell regions 110_1 and the row-hammer cells RHC of the row-hammer cell region 110_2, through the rows WL. The row control circuit 120 may activate a row corresponding to the internal input address IADD in response to activation of the active command ACT, and may precharge the activated word line in response to the precharge command PCG. The row control circuit 120 may perform a normal refresh operation of sequentially refreshing a plurality of rows WL corresponding to the counting address CADD according to the normal refresh command REF. The row control circuit 120 may perform a target refresh operation of refreshing one or more adjacent rows corresponding to the row-hammer address RH_ADD according to the target refresh command TREF.

The column control circuit 130 may include a first column control circuit 132 corresponding to the normal cell regions 110_1, and a second column control circuit 134 corresponding to the row-hammer cell region 110_2. The first column control circuit 132 may be coupled to the normal cells MC of the normal cell regions 110_1, through the columns BL. The second column control circuit 134 may be coupled to the row-hammer cells RHC of the row-hammer cell region 110_2, through the columns RH_BL different from the columns BL.

The first column control circuit 132 may select some columns among the columns BL, according to the internal input address IADD, read out the normal data from the normal cells MC through the selected columns in response to the read command RD, and write the normal data provided from the outside into the normal cells MC through the selected columns in response to the write command WT. The first column control circuit 132 may be coupled to a data pad DQ to transmit and receive the normal data to and from an external device.

The second column control circuit 134 may read out the first data CNT<0:m> and the second data FN # from the row-hammer cells RHC of the row-hammer cell region 110_2, according to the internal read signal IRD, and write the third data CNTD<0:m> and the fourth data FN #D into the row-hammer cells RHC of the row-hammer cell region 110_2, according to the internal write signal IWT. A detailed configuration and operation of the column control circuit 130 will be described in FIG. 2.

As described above, in accordance with an embodiment of the present invention, the memory device 100 may additionally dispose the row-hammer cell region 110_2 in the memory cell region 110, and store a counting value (i.e., the first data CNT<0:m>) obtained by counting the number of accesses to a corresponding row and information (or flag bits) (i.e., the second data FN #) on whether to refresh adjacent rows classified according to physical distance from the corresponding row, into the row-hammer cell region 110_2. When the active command ACT is inputted, the memory device 100 may select the sampling address SAM_ADD based on the first data CNT<0:m>, and update the first data CNT<0:m> and the second data FN #. Further, when the target refresh command TREF is issued, the memory device 100 may control physically closest rows (i.e., the first adjacent rows) to the target row corresponding to the sampling address SAM_ADD to be refreshed, and physically adjacent rows (i.e., the second adjacent rows) of the target row to be selectively refreshed based on second data FN #. That is, by selectively performing the target refresh operation on the adjacent rows, it is possible to improve the accuracy and refresh efficiency of the refresh operation. In addition, it is possible to optimize the row-hammer defense capability and minimize power consumption.

Hereinafter, referring to FIGS. 2 to 4B, a detailed configuration of the memory device 100 will be described. A case in which the first data CNT<0:m> is configured as 5-bit and the second data FN # is configured as first and second flag bits FN1 and FN2 will be described as an example.

Figure 2:
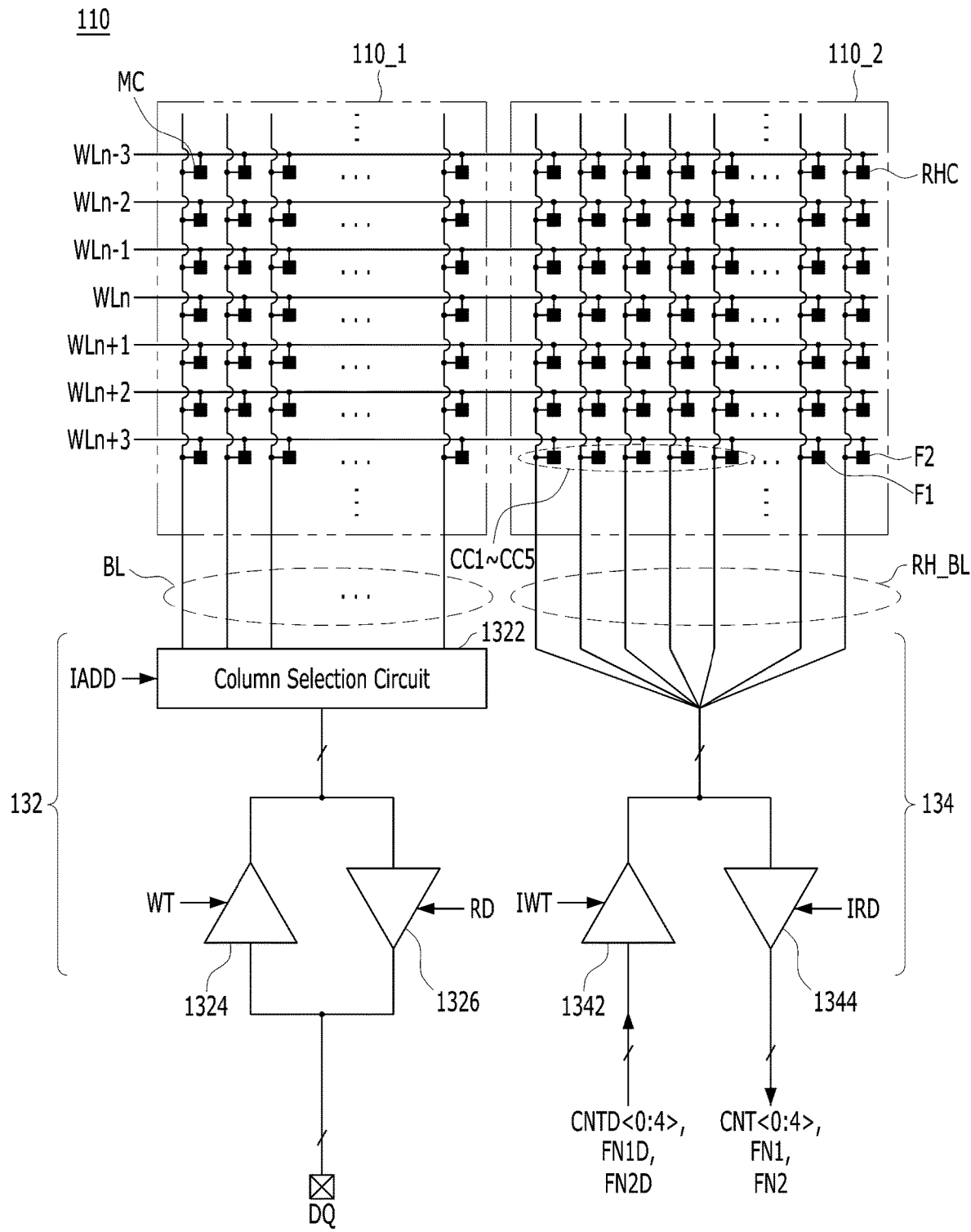
FIG. 2 is a detailed configuration illustrating a memory cell region and a column control circuit shown in FIG. 1 in accordance with an embodiment of the present invention.

FIG. 2 is a detailed configuration illustrating the memory cell region 110 and the column control circuit 130 shown in FIG. 1 in accordance with an embodiment of the present invention.

Referring to FIG. 2, the plurality of normal cells MC may be arranged in an array type in the normal cell regions 110_1 of the memory cell region 110, and the plurality of row-hammer cells RHC may be arranged in an array type in the row-hammer cell region 110_2 of the memory cell region 110. The normal cells MC and the row-hammer cells RHC may be coupled to each of the rows WL. Furthermore, though FIG. 2 shows that the normal cells MC and the row-hammer cells RHC are coupled to the same row, the present invention is not limited thereto. According to an embodiment, the normal cells MC and the row-hammer cells RHC are coupled to the respective rows different from each other.

The normal cells MC may be coupled between the rows WL and the columns BL, and store normal data including user data. The normal cells MC may be coupled to the first column control circuit 132 through the columns BL.

The first column control circuit 132 may include a column selection circuit 1322, a first input driving circuit 1324, and a first output driving circuit 1326. The column selection circuit 1322 may select some columns among the columns BL by decoding the internal input address IADD. The first input driving circuit 1324 may provide the normal data provided from the data pad DQ to the selected columns in response to the write command WT. Thus, the first column control circuit 132 may write the normal data into the normal cells MC during a write operation. The first input driving circuit 1324 may include a write driver. The first output driving circuit 1326 may output the normal data from the selected columns to the data pad DQ in response to the read command RD. Thus, the first column control circuit 132 may read out the normal data from the normal cells MC during a read operation. The first output driving circuit 1326 may include an input/output sense amplifier.

The row-hammer cells RHC may be coupled between the rows WL and the columns RH_BL, and store first data CNT<0:4> and second data FN1 and FN2. The row-hammer cells RHC may include first to fifth counting cells CC1 to CC5, and first and second flag cells F1 and F2. For example, in case of an n-th row WLn, the row-hammer cells RHC may include the first to fifth counting cells CC1 to CC5 for storing the number of accesses to the n-th row WLn, the first flag cell F1 for storing information on whether to refresh (n±2)-th adjacent rows WLn−2 and WLn+2 of the n-th row WLn, and the second flag cell F2 for storing information on whether to refresh (n±3)-th adjacent rows WLn−3 and WLn+3 of the n-th row WLn. The first data CNT<0:4> may be outputted from the first to fifth counting cells CC1 to CC5, the second data FN1 and FN2 may be outputted from the first and second flag cells F1 and F2. The row-hammer cells RHC may be coupled to the second column control circuit 134 through the columns RH_BL.

The second column control circuit 134 may include a second input driving circuit 1342, and a second output driving circuit 1344. The second input driving circuit 1342 may write third data CNTD<0:4> and fourth data FN1D and FN2D, which are provided from the refresh control circuit 150, into the row-hammer cells RHC in response to the internal write signal IWT. The second input driving circuit 1342 may include a write driver. The second output driving circuit 1344 may output the first data CNT<0:4> and the second data FN1 and FN2 from the row-hammer cells RHC to the refresh control circuit 150 in response to the internal read signal IRD. The second output driving circuit 1344 may include an input/output sense amplifier.

Figure 3:
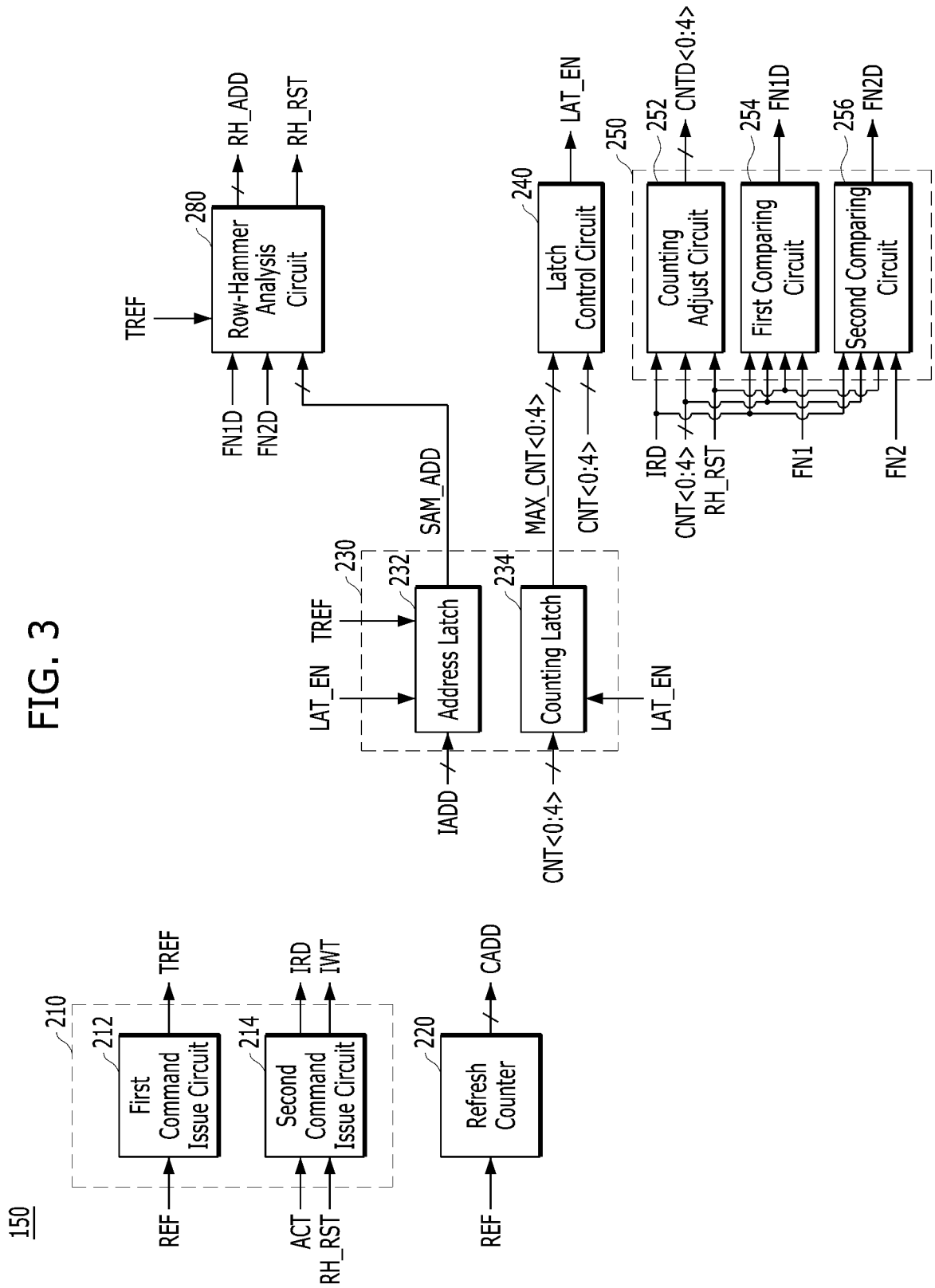
FIG. 3 is a detailed block diagram illustrating a refresh control circuit shown in FIG. 1 in accordance with an embodiment of the present invention.
Figures 4A, 4B:
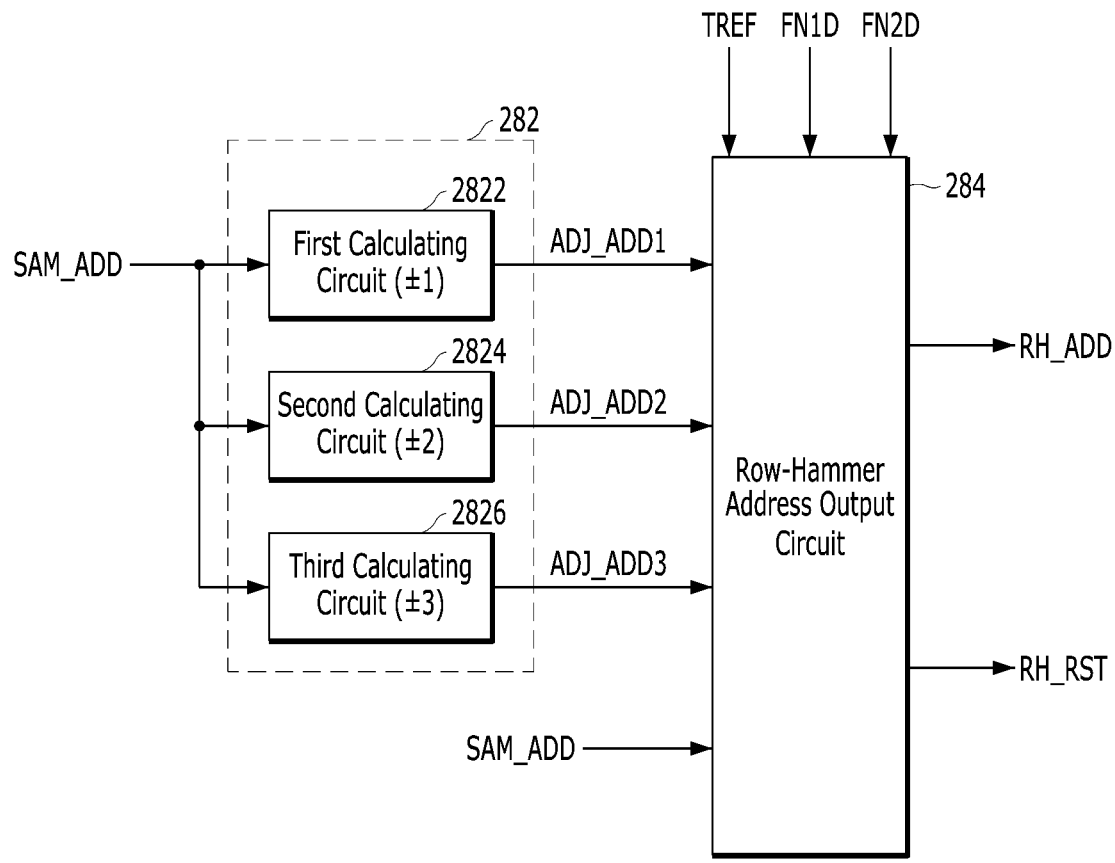
FIGS. 4A and 4B are a detailed block diagram and a table for describing a row-hammer analysis circuit shown in FIG. 3 in accordance with an embodiment of the present invention.

FIG. 3 is a detailed block diagram illustrating the refresh control circuit 150 shown in FIG. 1 in accordance with an embodiment of the present invention. FIGS. 4A and 4B are a detailed block diagram and a table for describing a row-hammer analysis circuit 280 shown in FIG. 3 in accordance with an embodiment of the present invention.

Referring to FIG. 3, the refresh control circuit 150 may include a command generation circuit 210, a refresh counter 220, a latch circuit 230, a latch control circuit 240, an update circuit 250, and a row-hammer analysis circuit 280.

The command generation circuit 210 may generate the target refresh command TREF according to the normal refresh command REF, and generate the internal read signal IRD and the internal write signal IWT according to the active command ACT and a row-hammer reset signal RH_RST. The command generation circuit 210 may include a first command issue circuit 212 and a second command issue circuit 214. The first command issue circuit 212 may count the number of inputs of the normal refresh command REF, and issue the target refresh command TREF when the counting number reaches the preset number. The second command issue circuit 214 may issue the internal read signal IRD and the internal write signal IWT according to the active command ACT and the row-hammer reset signal RH_RST. The second command issue circuit 214 may sequentially issue the internal read signal IRD and the internal write signal IWT when the active command ACT is inputted, and issue the internal write signal IWT when the row-hammer reset signal RH_RST is enabled.

The refresh counter 220 may generate the counting address CADD that is sequentially increasing whenever the normal refresh command REF is inputted.

The latch circuit 230 may store the internal input address IADD and the first data CNT<0:4> as the sampling address SAM_ADD and maximum counting data MAX_CNT<0:4>, respectively, according to a latch enable signal LAT_EN. For reference, the first data CNT<0:4> and the second data FN1 and FN2 may be provided through the second output driving circuit 1344 of FIG. 2 from a row corresponding to the internal input address IADD inputted together with the active command ACT. The latch circuit 230 may output the sampling address SAM_ADD to the row-hammer analysis circuit 280, in response to the target refresh command TREF. In detail, the latch circuit 230 may include an address latch 232 and a counting latch 234. The address latch 232 may store the internal input address IADD as the sampling address SAM_ADD according to the latch enable signal LAT_EN, and output the stored sampling address SAM_ADD to the row-hammer analysis circuit 280 according to the target refresh command TREF. The counting latch 234 may store the first data CNT<0:4> as the maximum counting data MAX_CNT<0:4> according to the latch enable signal LAT_EN. When the latch enable signal LAT_EN is enabled, the address latch 232 may store the internal input address IADD as the sampling address SAM_ADD, and the counting latch 234 may store the first data CNT<0:4> as the maximum counting data MAX_CNT<0:4>. When the latch enable signal LAT_EN is disabled, the address latch 232 may maintain the previously stored sampling address SAM_ADD, and the counting latch 234 may maintain the previously stored maximum counting data MAX_CNT<0:4>.

The latch control circuit 240 may generate the latch enable signal LAT_EN by comparing the first data CNT<0:4> with the maximum counting data MAX_CNT<0:4>. The latch control circuit 240 may enable the latch enable signal LAT_EN when a value of the first data CNT<0:4> is greater than or equal to a value of the maximum counting data MAX_CNT<0:4>. Depending on an embodiment, the latch control circuit 240 may generate the latch enable signal LAT_EN by comparing the first data CNT<0:4> with the maximum counting data MAX_CNT<0:4> after the internal read signal IRD is inputted.

The update circuit 250 may be initialized by the row-hammer reset signal RH_RST. The update circuit 250 may update the first data CNT<0:4> and the second data FN1 and FN2 when the internal read signal IRD is inputted. The update circuit 250 may store the updated first data CNT<0:4> and the updated second data FN1 and FN2 as the third data CNTD<0:4> and the fourth data FN1D and FN2D, respectively. The third data CNTD<0:4> and the fourth data FN1D and FN2D may be provided to the second input driving circuit 1342 of FIG. 2.

In detail, the update circuit 250 may include a counting adjust circuit 252, a first comparison circuit 254, and a second comparison circuit 256.

The counting adjust circuit 252 may increase a value of the first data CNT<0:4> by "+1" to output the third data CNTD<0:4> when the internal read signal IRD is inputted.

The first comparison circuit 254 may update a first flag bit FN1 of the second data FN1 and FN2 by verifying whether the value of the first data CNT<0:4> is greater than or equal to a first threshold value, and store the updated first flag bit FN1 as a first flag bit FN1D of the fourth data FN1D and FN2D, when the internal read signal IRD is inputted. For example, the first comparison circuit 254 may set the first threshold value to 300, and set and store the first flag bit FN1D as a high bit when the value of the first data CNT<0:4> is greater than or equal to 300. On the contrary, the first comparison circuit 254 may set the first flag bit FN1D to a high bit, regardless of the first data CNT<0:4>, when the first flag bit FN1 is set to a high bit.

The second comparison circuit 256 may update a second flag bit FN2 of the second data FN1 and FN2 by verifying whether the value of the first data CNT<0:4> is greater than or equal to a second threshold value, and store the updated second flag bit FN2 as a second flag bit FN2D of the fourth data FN1D and FN2D, when the internal read signal IRD is inputted. The second threshold value may be greater than the first threshold value. For example, the second comparison circuit 256 may set the second threshold value to 400, and set and store the second flag bit FN2D as a high bit when the value of the first data CNT<0:4> is greater than or equal to 400. On the contrary, the second comparison circuit 256 may set the second flag bit FN2D to a high bit, regardless of the first data CNT<0:4>, when the second flag bit FN2 is set to a high bit Moreover, the counting adjust circuit 252, the first comparison circuit 254, and the second comparison circuit 256 may be initialized by the row-hammer reset signal RH_RST. That is, when the row-hammer reset signal RH_RST is enabled, the counting adjust circuit 252, the first comparison circuit 254, and the second comparison circuit 256 may initialize the third data CNTD<0:4> and the fourth data FN1D and FN2D to a predetermined level (e.g., "0").

The row-hammer analysis circuit 280 may calculate first to third adjacent addresses (ADJ_ADD1 to ADJ_ADD3 of FIG. 4A) based on the sampling address SAM_ADD. For reference, the first to third adjacent addresses ADJ_ADD1 to ADJ_ADD3 may be addresses for designating adjacent rows of the target row corresponding to the sampling address SAM_ADD. For example, the first adjacent address ADJ_ADD1 may be an address for designating (n±1)-th adjacent rows of the n-th target row, the second adjacent address ADJ_ADD2 may be an address for designating (n±2)-th adjacent rows of the n-th target row, and the third adjacent address ADJ_ADD3 may be an address for designating (n±3)-th adjacent rows of the n-th target row. That is, as described in FIG. 1, the first adjacent address ADJ_ADD1 may be an address for designating the first adjacent rows that are physically closest to the target row, while the second and third ADJ_ADD2 and ADJ_ADD3 may be addresses for designating the second adjacent rows that are physically next closest to the target row, except for the first adjacent rows.

The row-hammer analysis circuit 280 may output the row-hammer address RH_ADD by scheduling the first to third adjacent addresses ADJ_ADD1 to ADJ_ADD3 based on the first flag bit FN1D and the second flag bit FN2D when the target refresh command TREF is inputted. The row-hammer analysis circuit 280 may enable the row-hammer reset signal RH_RST after outputting the row-hammer address RH_ADD.

Referring to FIG. 4A, the row-hammer analysis circuit 280 may include an adjacent address calculating circuit 282, and a row-hammer address output circuit 284.

The adjacent address calculating circuit 282 may calculate the first to third adjacent addresses ADJ_ADD1 to ADJ_ADD3 based on the sampling address SAM_ADD. For example, the adjacent address calculating circuit 282 may include first to third calculating circuits 2822 to 2826. The first calculating circuit 2822 may calculate at least one first adjacent address ADJ_ADD1 by increasing and/or decreasing the sampling address SAM_ADD by "+1". The second calculating circuit 2824 may calculate at least one second adjacent address ADJ_ADD2 by increasing and/or decreasing the sampling address SAM_ADD by "+2". The third calculating circuit 2826 may calculate at least one third adjacent address ADJ_ADD3 by increasing and/or decreasing the sampling address SAM_ADD by "+3". Depending on an embodiment, the adjacent address calculating circuit 282 may be activated according to the target refresh command TREF.

The row-hammer address output circuit 284 may schedule the first to third adjacent addresses ADJ_ADD1 to ADJ_ADD3 based on the first flag bit FN1D and the second flag bit FN2D, and output the scheduled adjacent addresses as the row-hammer address RH_ADD according to the target refresh command TREF. The row-hammer address output circuit 284 may enable the row-hammer reset signal RH_RST after outputting the scheduled adjacent addresses. The row-hammer address output circuit 284 may output the sampling address SAM_ADD as the row-hammer address RH_ADD when the row-hammer reset signal RH_RST is enabled.

Referring to FIG. 4B, when both of the first flag bit FN1D and the second flag bit FN2D are low bits, the row-hammer address output circuit 284 may output the first adjacent address ADJ_ADD1 as the row-hammer address RH_ADD according to the target refresh command TREF. Accordingly, (n±1)-th adjacent rows (i.e., the first adjacent rows) of the n-th target row may be refreshed.

When the first flag bit FN1D is a high bit and the second flag bit FN2D is a low bit, the row-hammer address output circuit 284 may sequentially output the first adjacent address ADJ_ADD1 and the second adjacent address ADJ_ADD2 as the row-hammer address RH_ADD whenever the target refresh command TREF is inputted. Accordingly, (n±1)-th adjacent rows (i.e., the first adjacent rows) of the n-th target row may be refreshed, and then (n±2)-th adjacent rows (i.e., the second adjacent rows) of the n-th target row may be refreshed. Thereafter, when the target refresh command TREF is inputted, the row-hammer address output circuit 284 may enable the row-hammer reset signal RH_RST and, at the same time, output the sampling address SAM_ADD as the row-hammer address RH_ADD. As a result, the certain values (e.g., all-zero values) may be written into the row-hammer cells RHC of the target row corresponding to the sampling address SAM_ADD, and thus the row-hammer cells RHC may be initialized.

When both of the first flag bit FN1D and the second flag bit FN2D are high bits, the row-hammer address output circuit 284 may sequentially output the first adjacent address ADJ_ADD1, the second adjacent address ADJ_ADD2, and the third adjacent address ADJ_ADD3 as the row-hammer address RH_ADD whenever the target refresh command TREF is inputted. Accordingly, (n±1)-th adjacent rows (i.e., the first adjacent rows) of the n-th target row may be refreshed, and then (n±2)-th adjacent rows (i.e., the second adjacent rows) of the n-th target row may be refreshed, and then (n±3)-th adjacent rows (i.e., the second adjacent rows) of the n-th target row may be refreshed. Thereafter, when the target refresh command TREF is inputted, the row-hammer address output circuit 284 may enable the row-hammer reset signal RH_RST and, at the same time, output the sampling address SAM_ADD as the row-hammer address RH_ADD. As a result, the certain values (e.g., all-zero values) may be written into the row-hammer cells RHC of the target row corresponding to the sampling address SAM_ADD, and thus the row-hammer cells RHC may be initialized.

Hereinafter, referring to FIGS. 1 to 6, an operation of the semiconductor memory device 100 will be described.

Figure 5:
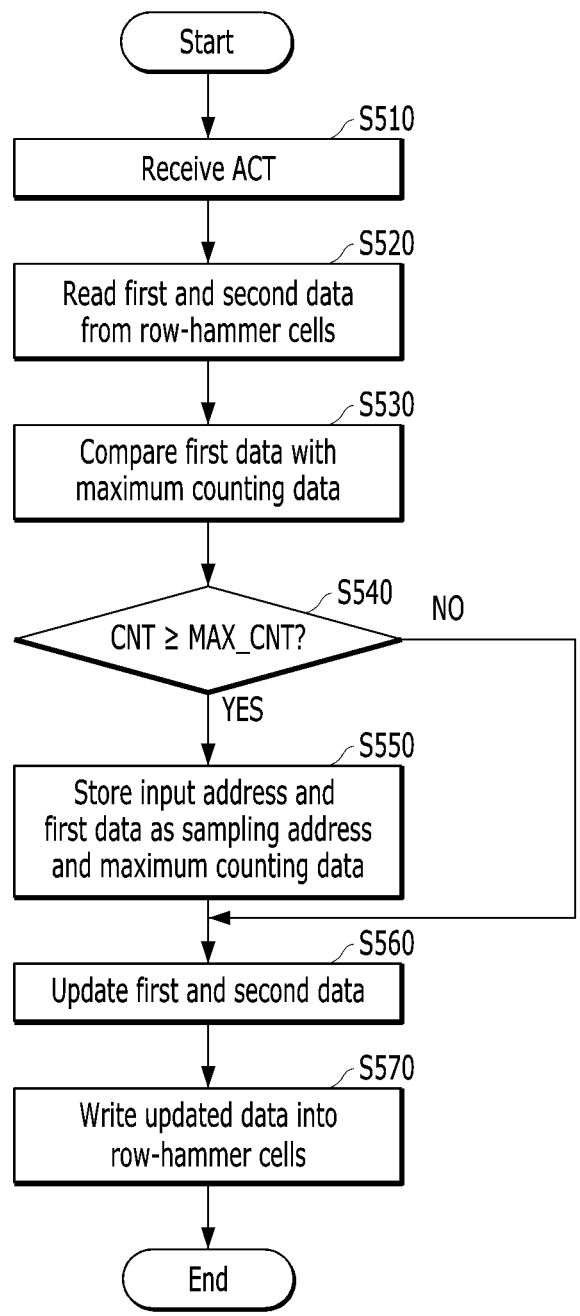
FIG. 5 is a flow chart illustrating an operation of a semiconductor memory device in accordance with an embodiment of the present invention.
Figure 6:
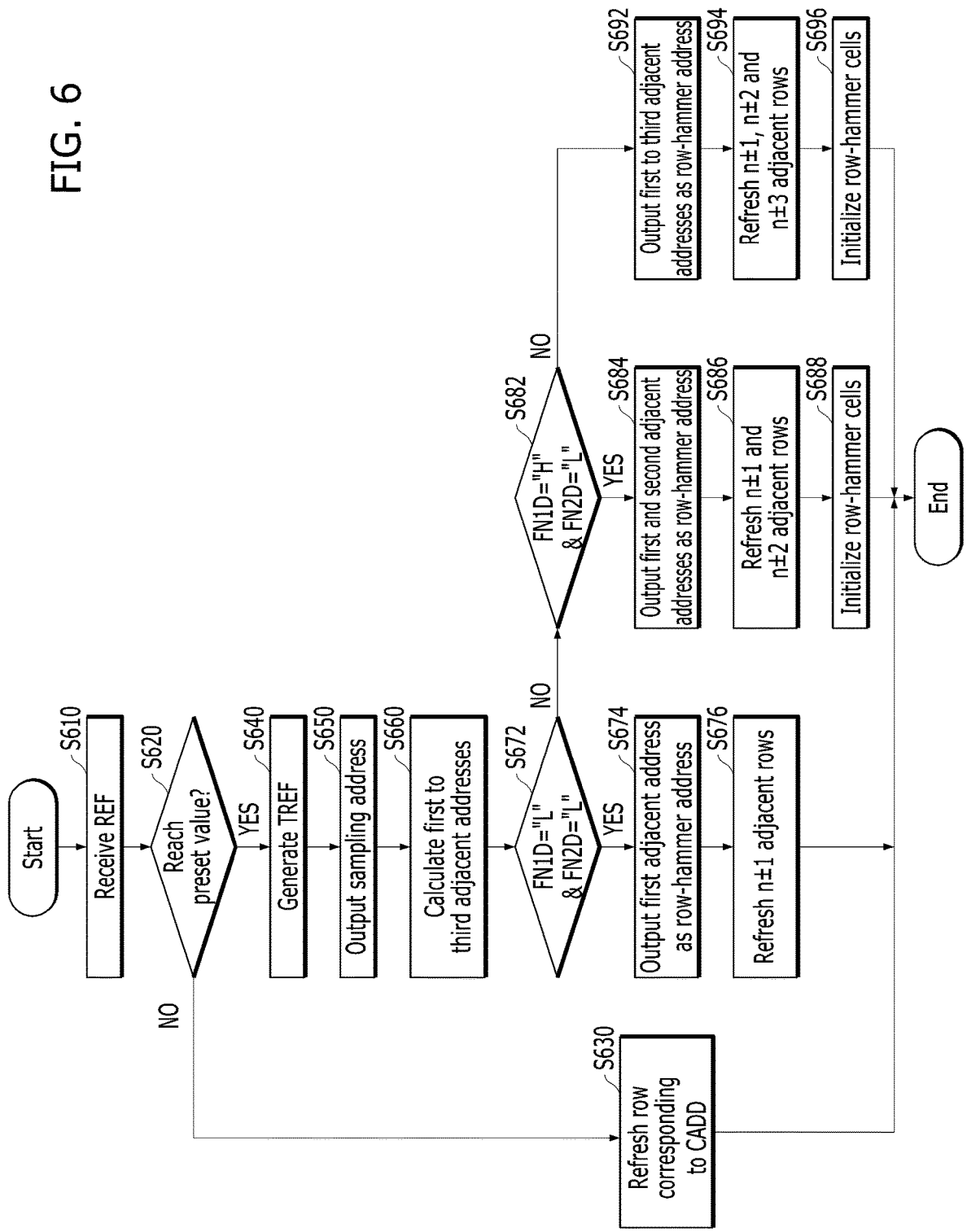
FIG. 6 is a flow chart illustrating an operation of a semiconductor memory device in accordance with an embodiment of the present invention.

FIGS. 5 and 6 are flow charts illustrating an operation of the semiconductor memory device 100 in accordance with an embodiment of the present invention.

Referring to FIG. 5, an operation of the semiconductor memory device 100 when the active command ACT is inputted is shown.

When the active command ACT is inputted (at S510), the second command issue circuit 214 may issue the internal read signal IRD. The second column control circuit 134 may read out the first data CNT<0:4> and the second data FN1 and FN2 from the row-hammer cells RHC of a row corresponding to the internal input address IADD, according to the internal read signal IRD (at S520). The latch control circuit 240 may generate the latch enable signal LAT_EN by comparing the first data CNT<0:4> with the maximum counting data MAX_CNT<0:4> stored in the counting latch 234 (at S530).

When a value of the first data CNT<0:4> is greater than or equal to a value of the maximum counting data MAX_CNT<0:4> ("YES" of S540), the latch control circuit 240 may enable the latch enable signal LAT_EN, and thus the latch circuit 230 may store the internal input address IADD and the first data CNT<0:4> as the sampling address SAM_ADD and the maximum counting data MAX_CNT<0:4>, respectively (at S550).

When the value of the first data CNT<0:4> is smaller than the value of the maximum counting data MAX_CNT<0:4> ("NO" of S540), the latch control circuit 240 may disable the latch enable signal LAT_EN, and the latch circuit 230 may maintain the previously values of the sampling address SAM_ADD and the maximum counting data MAX_CNT<0:4>.

The update circuit 250 may update the first data CNT<0:4> and the second data FN1 and FN2 when the internal read signal IRD is inputted (at S560). In detail, the counting adjust circuit 252 may increase a value of the "+1" first data CNT<0:4> to output the third data CNTD<0:4>. The first comparison circuit 254 may update the first flag bit FN1 by verifying whether the value of the first data CNT<0:4> is greater than or equal to the first threshold value, and store the updated first flag bit FN1 as the first flag bit FN1D. The second comparison circuit 256 may update the second flag bit FN2 by verifying whether the value of the first data CNT<0:4> is greater than or equal to the second threshold value, and store the updated second flag bit FN2 as the second flag bit FN2D.

Thereafter, the second command issue circuit 214 may issue the internal write signal IWT. The second column control circuit 134 writes the third data CNTD<0:4> and the fourth data FN1D and FN2D provided from the refresh control circuit 150, into row-hammer cells RHC of the row corresponding to the internal input address IADD, according to the internal write signal IWT (at S570).

Referring to FIG. 6, an operation of the semiconductor memory device 100 when the normal refresh command REF is inputted is shown in accordance with an embodiment of the present invention.

When the normal refresh command REF is inputted (at S610), the refresh counter 220 may generate the counting address CADD that is sequentially increasing. Until the number of inputs of the normal refresh command REF reaches the preset number ("NO" of S620), the row control circuit 120 may perform a normal refresh operation of sequentially refreshing the plurality of rows corresponding to the counting address CADD according to the normal refresh command REF (at S630).

When the number of inputs of the normal refresh command REF reaches the preset number ("YES" of S620), the first command issue circuit 212 may issue the target refresh command TREF (at S640).

The latch circuit 230 may output the sampling address SAM_ADD to the row-hammer analysis circuit 280, in response to the target refresh command TREF (at S650).

The row-hammer analysis circuit 280 may calculate the first to third adjacent addresses ADJ_ADD1 to ADJ_ADD3 based on the sampling address SAM_ADD (at S660). The row-hammer analysis circuit 280 may calculate at least one first adjacent address ADJ_ADD1 by increasing and/or decreasing the sampling address SAM_ADD by "+1", calculate at least one second adjacent address ADJ_ADD2 by increasing and/or decreasing the sampling address SAM_ADD by "+2", and calculate at least one third adjacent address ADJ_ADD3 by increasing and/or decreasing the sampling address SAM_ADD by "+3".

The row-hammer analysis circuit 280 may schedule the first to third adjacent addresses ADJ_ADD1 to ADJ_ADD3 based on the first flag bit FN1D and the second flag bit FN2D, and output the scheduled adjacent addresses as the row-hammer address RH_ADD according to the target refresh command TREF.

In detail, when both of the first flag bit FN1D and the second flag bit FN2D are low bits ("YES" of S672), the row-hammer analysis circuit 280 may output the first adjacent address ADJ_ADD1 as the row-hammer address RH_ADD according to the target refresh command TREF (at S674). The row control circuit 120 may perform a target refresh operation of refreshing one or more adjacent rows corresponding to the row-hammer address RH_ADD according to the target refresh command TREF. Thus, (n±1)-th adjacent rows (i.e., the first adjacent rows) of the n-th target row may be only refreshed (at S676).

When the first flag bit FN1D is a high bit and the second flag bit FN2D is a low bit ("YES" of S682), the row-hammer analysis circuit 280 may sequentially output the first adjacent address ADJ_ADD1 and the second adjacent address ADJ_ADD2 as the row-hammer address RH_ADD whenever the target refresh command TREF is inputted (at S684). The row control circuit 120 may perform a target refresh operation of refreshing one or more adjacent rows corresponding to the row-hammer address RH_ADD according to the target refresh command TREF. Thus, (n±1)-th adjacent rows (i.e., the first adjacent rows) and (n±2)-th adjacent rows (i.e., the second adjacent rows) of the n-th target row may be refreshed (at S686). Thereafter, when the target refresh command TREF is inputted, the row-hammer analysis circuit 280 may enable the row-hammer reset signal RH_RST and, at the same time, output the sampling address SAM_ADD as the row-hammer address RH_ADD. Accordingly, as the row-hammer reset signal RH_RST is enabled, the second command issue circuit 214 may issue the internal write signal IWT, and the counting adjust circuit 252, the first comparison circuit 254, and the second comparison circuit 256 may be initialized. The second column control circuit 134 may write the third data CNTD<0:4> and the fourth data FN1D and FN2D, which are initialized, into row-hammer cells RHC of the target row corresponding to the sampling address SAM_ADD, according to the internal write signal IWT (at S688). As a result, the row-hammer cells RHC may be initialized.

When both of the first flag bit FN1D and the second flag bit FN2D are high bits ("NO" of S682), the row-hammer analysis circuit 280 may sequentially output the first to third adjacent addresses ADJ_ADD1 to ADJ_ADD3 as the row-hammer address RH_ADD whenever the target refresh command TREF is inputted (at S692). Accordingly, (n±1)-th adjacent rows (i.e., the first adjacent rows) and (n±2)-th and (n±3)-th adjacent rows (i.e., the second adjacent rows) of the n-th target row may be refreshed (at S694). Thereafter, when the target refresh command TREF is inputted, the row-hammer analysis circuit 280 may enable the row-hammer reset signal RH_RST and, at the same time, output the sampling address SAM_ADD as the row-hammer address RH_ADD. Accordingly, the row-hammer cells RHC of the target row corresponding to the sampling address SAM_ADD may be initialized (at S696).

As described above, the memory device 100 in accordance with an embodiment may additionally dispose the row-hammer cell region 110_2 in the memory cell region 110, and store, into the row-hammer cells RHC of the row-hammer cell region 110_2, the first data CNT<0:m> obtained by counting the number of accesses to a corresponding row, and the second data FN # indicating whether adjacent rows are refreshed with different refresh rates according to the physical distance from the corresponding row. When the active command ACT is inputted, the memory device 100 may select the sampling address SAM_ADD based on the first data CNT<0:m>. Further, when the target refresh command TREF is issued, the memory device 100 may calculate the adjacent addresses based on the sampling address SAM_ADD, and output the row-hammer address RH_ADD by scheduling the adjacent addresses based on the second data FN #. Thus, since the memory device 100 may selectively perform the target refresh operation according to the row-hammer address RH_ADD, it is possible to improve the accuracy and refresh efficiency of the refresh operation. In addition, it is possible to optimize the row-hammer defense capability and minimize power consumption.

Various embodiments of the present disclosure have been described in the drawings and specification. Although specific terminologies are used here, the terminologies are only to describe the embodiments of the present disclosure. Therefore, the present disclosure is not restricted to the above-described embodiments and many variations are possible within the spirit and scope of the present disclosure. It should be apparent to those skilled in the art that various modifications can be made on the basis of the technological scope of the present disclosure in addition to the embodiments disclosed herein. The embodiments may be combined to form additional embodiments It should be noted that although the technical spirit of the disclosure has been described in connection with embodiments thereof, this is merely for description purposes and should not be interpreted as limiting. It should be appreciated by one of ordinary skill in the art that various changes may be made thereto without departing from the technical spirit of the disclosure and the following claims.

For example, for the logic gates and transistors provided as examples in the above-described embodiments, different positions and types may be implemented depending on the polarity of the input signal.

What is claimed is:

1. A semiconductor memory device, comprising:
a memory cell region including a plurality of normal cells and a plurality of row-hammer cells coupled to each of a plurality of rows, wherein the row-hammer cells of a selected row are suitable for storing first data and second data, the first data representing a number of accesses to the selected row and the second data denoting whether to refresh second adjacent rows of the selected row; and
a refresh control circuit suitable for:
when an active command associated with an input address is inputted and based on the number of accesses read from the first data of the row-hammer cells corresponding to the input address, selecting a sampling address corresponding to the input address,
determining, in response to a refresh command, whether to refresh first adjacent rows physically closest to a target row corresponding to the sampling address, and
determining, in response to the refresh command, whether to refresh second adjacent rows physically adjacent to the target row, other than the first adjacent rows, based on the second data read from the target row.

2. The semiconductor memory device of claim 1,
wherein the rows are sequentially arranged in a column direction, and
wherein the first adjacent rows of an n-th row are (n±1)-th rows physically closest to the n-th row, and the second adjacent rows of the n-th row are (n±k)-th rows physically adjacent to the n-th row, where k is an integer greater than or equal to 2.

3. The semiconductor memory device of claim 1, wherein the refresh control circuit is further suitable for updating the first data and the second data stored in the row-hammer cells of the row corresponding to the input address when the active command is inputted.

4. The semiconductor memory device of claim 1, wherein the refresh control circuit is further suitable for issuing a target refresh command, when a number of inputs of the refresh command reaches a preset number, to refresh the first adjacent rows of the target row and to selectively refresh the second adjacent rows of the target row based on the second data, when the refresh command is inputted.

5. The semiconductor memory device of claim 1, wherein the refresh control circuit is further suitable for initializing, after the selective refresh of the second adjacent rows of the target row, the row-hammer cells of the target row.

6. The semiconductor memory device of claim 1, wherein the refresh control circuit includes:
a command generation circuit suitable for generating a target refresh command according to the refresh command, and generating an internal read signal and an internal write signal according to the active command and a row-hammer reset signal;
a latch circuit suitable for storing, according to a latch enable signal, the input address and the first data respectively as the sampling address and maximum counting data;
a latch control circuit suitable for generating the latch enable signal by comparing the first data with the maximum counting data; and
a row-hammer analysis circuit suitable for calculating a plurality of adjacent addresses based on the sampling address, outputting a row-hammer address by scheduling the adjacent addresses based on the second data according to the target refresh command, and enabling the row-hammer reset signal.

7. The semiconductor memory device of claim 6, further comprising:
a row control circuit suitable for refreshing one or more rows corresponding to the row-hammer address according to the target refresh command; and
a column control circuit suitable for outputting data from the row-hammer cells according to the internal read signal and writing data into the row-hammer cells according to the internal write signal.

8. The semiconductor memory device of claim 6, wherein the refresh control circuit further includes:
   a counting adjust circuit initialized by the row-hammer reset signal, and suitable for increasing the number represented by the first data according to the internal read signal; and
   a comparison circuit initialized by the row-hammer reset signal, and suitable for updating the second data depending on whether the number becomes greater than or equal to a threshold value.

9. The semiconductor memory device of claim 6, wherein the row-hammer analysis circuit includes:
   an adjacent address calculating circuit suitable for calculating the adjacent addresses based on the sampling address; and
   a row-hammer address output circuit suitable for scheduling the adjacent addresses based on the second data, outputting the scheduled adjacent addresses as the row-hammer address according to the target refresh command, and then enabling the row-hammer reset signal.

10. An operating method of a memory device including plural rows each comprising memory cells, the operating method comprising:
   updating, whenever accessing a selected row among the plural rows, first data representing an accumulated number of accesses to the selected row, the first data being stored in the selected row, the first data representing a number of accesses to the selected row;
   updating second data when the accumulated number reaches a threshold, the second data being stored in the selected row, the second data denoting whether to refresh second rows of the plural rows;
   refreshing first rows physically closest to a target row, which is identified on the basis of the first data stored in a row indicated by an active address among the plural rows;
   refreshing, depending on the second data stored in the target row at a time of the refreshing of the first rows, the second rows physically adjacent to the target row than remaining rows other than the first rows among the plural rows; and
   initializing the first data and the second data stored in the target row after the refreshing of the second rows.

* * * * *